United States Patent
Miller et al.

(10) Patent No.: US 7,580,266 B2
(45) Date of Patent: Aug. 25, 2009

(54) RACK UNIT FRAME HOUSING

(75) Inventors: Steven Edwin Miller, Nevada City, CA (US); Scott Raitt, Grass Valley, CA (US)

(73) Assignee: Thomson Licensing, Boulogne-Billancourt (FR)

( * ) Notice: Subject to any disclaimer, the term of this patent is extended or adjusted under 35 U.S.C. 154(b) by 100 days.

(21) Appl. No.: 11/578,399

(22) PCT Filed: Apr. 15, 2005

(86) PCT No.: PCT/US2005/012977

§ 371 (c)(1),
(2), (4) Date: Oct. 12, 2006

(87) PCT Pub. No.: WO2005/104641

PCT Pub. Date: Nov. 3, 2005

(65) Prior Publication Data

US 2007/0291453 A1      Dec. 20, 2007

Related U.S. Application Data

(60) Provisional application No. 60/562,858, filed on Apr. 15, 2004.

(51) Int. Cl.
*H05K 7/00* (2006.01)
(52) U.S. Cl. .................. 361/728; 361/801; 361/802
(58) Field of Classification Search .............. 361/816, 361/818, 810, 825, 826, 600, 679, 752–753, 361/790, 797, 800–802, 756; 312/223
See application file for complete search history.

(56) References Cited

U.S. PATENT DOCUMENTS

| | | | | |
|---|---|---|---|---|
| 4,718,085 A | * | 1/1988 | Haskins | 379/438 |
| 5,071,367 A | * | 12/1991 | Luu | 439/501 |
| 5,469,844 A | * | 11/1995 | Rogler | 600/300 |
| 5,586,002 A | * | 12/1996 | Notarianni | 361/681 |
| 5,760,766 A | * | 6/1998 | Auber et al. | 345/167 |
| 5,844,763 A | | 12/1998 | Grace et al. | |
| 6,109,958 A | * | 8/2000 | Ke | 439/535 |
| 6,135,810 A | * | 10/2000 | Damson et al. | 439/501 |
| 2003/0002261 A1 | | 1/2003 | Berry et al. | |
| 2004/0207981 A1 | | 10/2004 | Gorenz, Jr. et al. | |

FOREIGN PATENT DOCUMENTS

WO         WO 96/33599 A      10/1996

OTHER PUBLICATIONS

International Search Report Dated Aug. 30, 2005.

* cited by examiner

*Primary Examiner*—Hung S Bui
(74) *Attorney, Agent, or Firm*—Robert D. Shedd; Robert B. Levy; Jorge Tony Villabon

(57) ABSTRACT

An improved rack unit assembly having at least one receptacle, such as a power receptacle, includes a cover for removable attachment to the assembly, where the panel includes an opening in the panel for permitting a connector on a cord, such as a power cord, to extend through the panel to releasably engage the at least one receptacle in the assembly, and a channel originating at the opening for receiving and guiding the cord. Optionally, the channel in the cover may include tabs along the channel for keeping the cord in the channel and the opening of the cover for the rack unit may include a means of strain relief for preventing the connector on the cord from inadvertently disengaging from the receptacle.

18 Claims, 4 Drawing Sheets

RACK UNIT FRAME HOUSING

CROSS-REFERENCE TO RELATED APPLICATIONS

This application claims the benefit, under 35 U.S.C. § 365 of International Application PCT/US05/012977 filed Apr. 15, 2005, which was published in accordance with PCT Article 21(2) on Nov. 3, 2005 in English and which claims the benefit of U.S. provisional patent application No. 60/562,858, filed Apr. 15, 2005.

TECHNICAL FIELD

This invention relates to rack mount systems, and more particularly, to an improved, high density rack unit.

BACKGROUND ART

High density channel systems, such as computer network server systems and related components, are typically housed in equipment racks configured to assimilate a plurality of component devices (rack units). System equipment racks provide efficient organization for the plurality of components for ease of access, serviceability, expandability, power distribution, cooling, and the like.

A typical prior art system equipment rack includes power distribution, sequencing, and regulation units, and space to receive a plurality of component devices such as network servers, routers, mass storage devices, tape back-up devices, and other similar related component devices, in addition to providing for serviceability access, power cord routing, air circulation and the like. In typical prior art system equipment racks, generally accepted and standardized sizes for the various component devices (rack units) provide for efficient space utilization, ease and predictability of system configuration, serviceability, and facility location. A "rack unit" is generally accepted as being approximately 1.75 inches in height, and 17.5 inches in width, with a depth ranging from approximately 18 inches to approximately 36 inches to accommodate a plurality of component devices.

In a typical prior art system equipment rack, a plurality of component devices are stacked within the equipment rack in rack unit locations provided within the equipment rack, with a typical configuration accommodating up to 16 dual input component devices (rack units) or 32 single input component devices (rack units). In a bottom region of the system equipment rack, power sequencers having a usual dimension of approximately two rack units are positioned to provide power and power sequencing to the component devices housed within the system rack. Individual power cords are typically routed within the system equipment rack from the power sequencers upwards through the system equipment rack to each of the component devices (rack units). In prior art system equipment racks, the individual power cords are typically all routed together and attached to each of the respective rear panels of each of the component devices (rack units) so as to not interfere with the insertion or removal of the component devices (rack units) from the equipment rack when necessary or so as to not interfere with the serviceability access to the component devices (rack units).

However, as the demand for the intercommunication of greater amounts of information and data increases, so does the need to maximize the efficient utilization of available space in the equipment rack systems and in each of the individual component devices (rack units). As previously mentioned, the power connections for each of the component devices (rack units) of an equipment rack system are typically facilitated using the rear panel of the individual component devices (rack units). Such a connection, however, reduces the number of input and output connections that are able to be provided by the individual rack units because the power connections consume valuable space in the rear panel that could be more efficiently and effectively utilized for additional connections for the component devices. What is needed is an efficient rack unit design to increase capacity, serviceability, and economy of space requirements.

BRIEF SUMMARY OF THE INVENTION

The present invention addresses the deficiencies of the prior art by providing an improved, high density rack unit.

In one embodiment of the present invention, a cover for a rack unit assembly having a receptacle, such as a power receptacle, within the assembly includes a panel for removable attachment to the assembly, where the panel includes an opening in the panel for permitting a connector on a cord, such as a power cord, to extend through the panel to releasably engage the receptacle in the assembly, and a channel originating at the opening for receiving and guiding the cord. Optionally, the channel in the cover may include tabs along the channel for keeping the cord in the channel and the opening of the cover for the rack unit may include a means of strain relief for preventing the connector on the cord from inadvertently disengaging from the receptacle.

In an alternate embodiment of the present invention, a rack unit assembly includes at least a chassis having a receptacle therein, and a top cover for removable attachment to the chassis, the top cover including an opening for permitting a connector on a cord to extend through the top cover to releasably engage the receptacle in the chassis, and a channel originating at the opening for receiving and guiding the cord. The rack unit assembly of the present invention may further include a bottom cover for removable attachment to the chassis, a front panel for removable attachment to the top cover and the bottom cover, and a rear panel for removable attachment to the top cover and the bottom cover, where the rack unit is assembled without utilizing hardware. That is, in various embodiments of the present invention, the top cover and bottom cover each include at least one male protrusion for engaging with at least one corresponding cutout in the chassis for securing the top cover and the bottom cover to the chassis, and the top cover and bottom cover each further include at least one tab for engaging with at least one corresponding cutout in the rear panel and the front panel for securing the rear panel and front panel to the top cover and the bottom cover.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention advantageously provides an improved, high density rack unit. Although throughout the teachings herein and in various embodiments of the present invention, the aspects of the present invention are described with respect to facilitating a power connection in an audio/video router, the specific embodiments of the present invention should not be treated as limiting the scope of the invention. It will be appreciated by those skilled in the art and informed by the teachings of the present invention that the concepts of the present invention can be advantageously applied to rack units for other rack mount systems and components and for facilitating other forms of connections, such as communication connections and the like.

Figure 1:
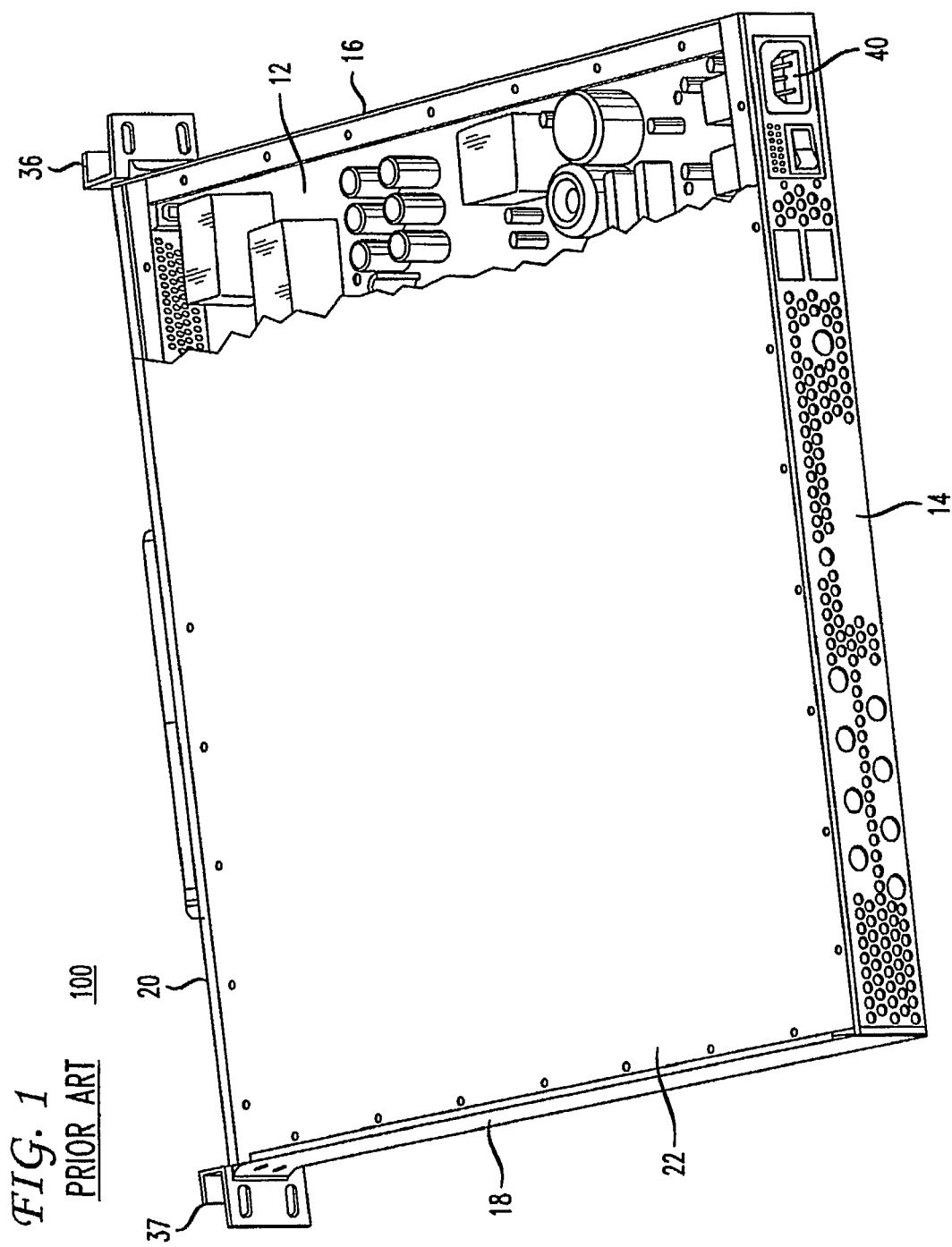
FIG. 1 depicts a high level diagram of a typical prior art single rack-unit.

FIG. 1 depicts a high level block diagram of a typical prior art single "rack unit" which is commonly referred to as a 1RU unit. The single rack unit 100 of FIG. 1 illustratively comprises a base 12 having a rear panel 14, left 16 and right 18 side walls, a front panel 20, and a top cover 22. In the single rack-unit 100 of FIG. 1, the front panel 20 includes left and right handles (rack ears) 36 and 37 respectively, to aid a user with inserting and removing the single rack-unit 100 from an industry standard communications infrastructure equipment rack (not shown).

As depicted in FIG. 1, the single rack unit 100 includes a power receptacle 40 on the right side of the rear panel 14 for providing power to the single rack unit 100. As such and as depicted in FIG. 1 by the cut-out portion in the top cover 22, the right side of the single rack unit 100 is reserved for a power supply circuitry chamber 58 for housing power components. The inclusion of the power receptacle 40 in the rear panel of the single rack unit 100 reduces the number of connections that may be provided in the rear panel of the single rack unit 100 because of the amount of space utilized by the power receptacle 40.

Figure 2:
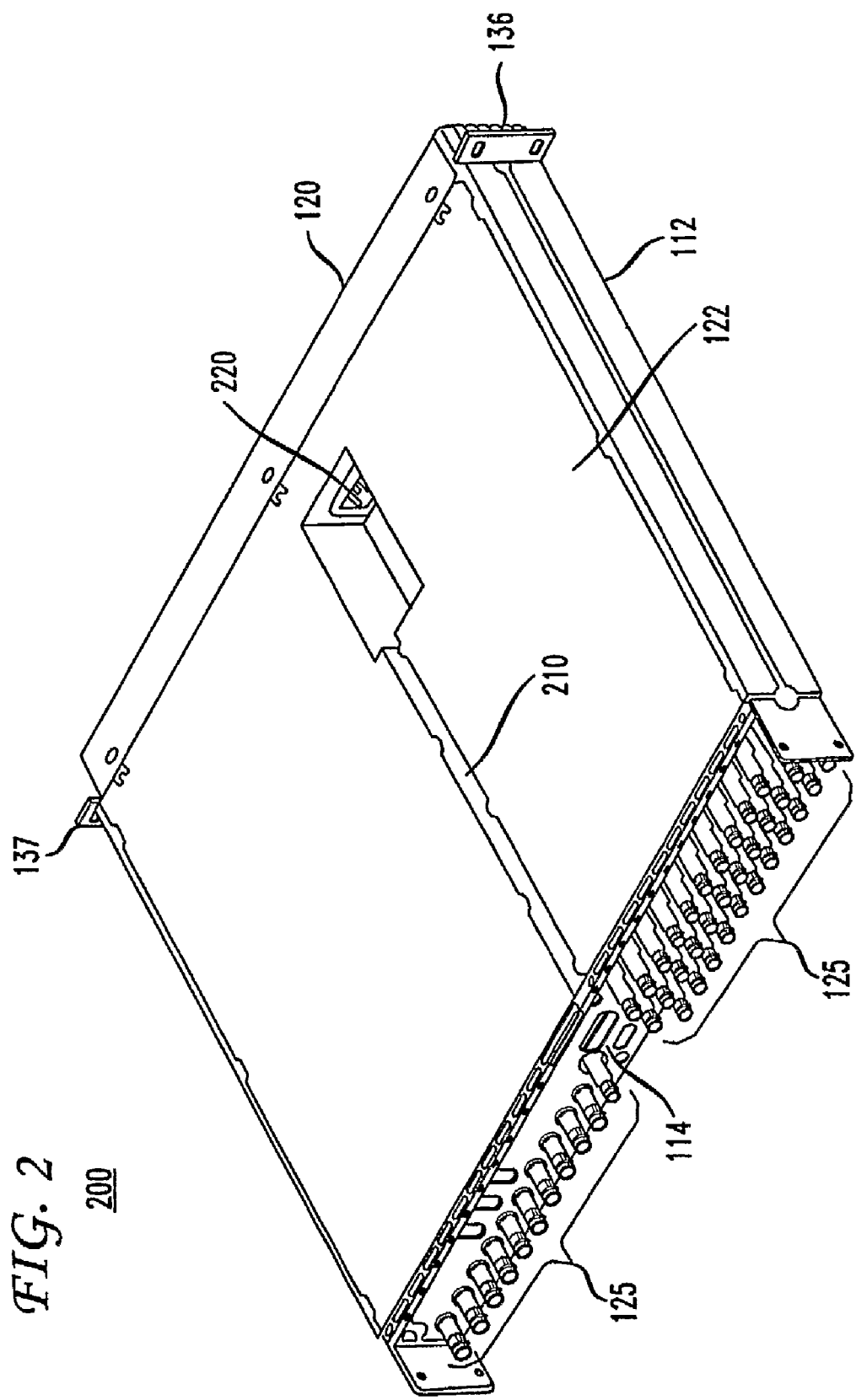
FIG. 2 depicts a high level diagram of a single rack unit in accordance with an embodiment of the present invention.

FIG. 2 depicts a high level diagram of a rack unit in accordance with an embodiment of the present invention. The rack unit of FIG. 2 illustratively embodies an audio/video router. The audio/video router 200 of FIG. 2 illustratively comprises a chassis 110, a bottom cover 112, a rear panel 114, a front panel 120, and a top cover 122. In the audio/video router 200 of FIG. 2, the chassis 110 includes left and right handles (rack ears) 136 and 137 respectively, to aid a user with inserting and removing the audio/video router 200 from an industry standard communications infrastructure equipment rack (not shown).

As depicted in FIG. 2, through the rear panel 114 of the audio/video router 200 protrude a plurality of input and output audio and video connections, 125. However, to increase the available space for input and output audio and video connections, the power connection in the audio/video router 200 of FIG. 2 is not located near the rear of the audio/video router 200 and is not accessed via the rear panel 114 as in prior art systems but is instead located near the forward half of the audio/video router 200 (described in greater detail below with respect to FIG. 3). Although in FIG. 2 (and FIG. 3 below) the concepts of the present invention are described with respect to facilitating a power connection in an inventive rack unit, the concepts of the present invention are not so limited. In alternate embodiments of the present invention the concepts of the present invention are applied to facilitate other connections, such as communication connections, in an inventive rack unit in accordance with the present invention. More specifically, in alternate embodiments of the present invention, a cord guide is provided to route a communications cord, such as an RS-232 cable or an IEEE488 cable, and an associated access opening is provided to facilitate the connection of a connector of the respective cord to a receptacle for that particular connector, such as an RS-232 receptacle or an IEEE488 receptacle. An important aspect of the present invention includes making available, in a rear panel of an inventive rack unit, more space for input and output connectors by facilitating connections typically made in a rear panel of a rack unit through a top and/or a bottom cover using cord guides and access openings in the top cover and/or the bottom cover of an inventive rack unit in accordance with the present invention.

For example and referring back to FIG. 2, in the audio/video router 200, the top cover 122 of the audio/video router 200 comprises a cord guide 210 and an access opening 220. That is, a cord guide 210 is formed along the top of the top cover 122 such that a cord, such as a power cord for the example of FIG. 2, can be placed and routed within the cord guide 210. For example, in one embodiment of the present invention, the top cover may be injection molded and the cord guide 210 formed in the top cover as such. The cord guide 210 terminates with the access opening 220. The cord guide 210 enables a power cord to be routed along the top cover 122 of the audio/video router 200 in a manner so that the power cord does not interfere with the ability to house the audio/video router in a compartment provided for the housing of a standard rack unit in an industry standard communications infrastructure equipment rack. That is, the cord guide 210 and the access opening 220 of the present invention provide a novel means for facilitating a power connection to a rack unit (i.e., connecting the power cord to the power receptacle of the audio/video router 200) that allows for more connectors on a rear panel and that does not interfere with the dimensions or space requirements needed for housing a rack unit (e.g., the audio/video router) in an industry standard communications infrastructure equipment rack (not shown). In the embodiment of FIG. 2, the cord guide 210 and the access opening 220 in the top cover of a rack unit in accordance with the present invention provide a means for facilitating a power connection and routing a power cord such that the power cord does not interfere with the insertion or removal of rack units from an equipment rack when necessary, so as to not interfere with the serviceability access to the rack units.

More specifically, in one embodiment of the present invention, a power cord is routed along the top cover 122 of the audio/video router 200 of FIG. 2 such that the power cord does not at all protrude higher than the top of the top cover 122 and as such does not interfere with the dimensions or space requirements needed for housing an audio/video router (rack unit) in accordance with the present invention. In alternate embodiments of the present invention, the power cord only minimally protrudes out of the cord guide and as such also does not interfere with the dimensions or space requirements needed for housing an audio/video router (rack unit) in accordance with the present invention.

The size and shape of the cord guide in a rack unit in accordance with the present invention depends on the size and numbers of cords to be routed along, for example, the top cover of the rack unit to the receptacles, such as power connection(s). As such, although in FIG. 2 and FIG. 3 (described below) the cord guide 210 is depicted as comprising a specific size and shape, it will be appreciated by one skilled in the art and informed by the teachings of the present invention, that a cord guide of the present invention may comprise substantially any size and shape needed to maintain and guide a cord or cords needed to facilitate a connection or connections for a rack unit of the present invention.

In the embodiment of FIG. 2, the access opening 220 of the top cover 122 provides access to the power connection of the audio/video router 200 of FIG. 2, which as previously mentioned, is located near the forward half of the audio/video router 200. In one embodiment of the present invention, a power cord is routed along the cord guide 210 of the top cover 122 and a power connector at the end of the power cord is connected to a power receptacle of the audio/video router 200 made accessible by the access opening 220 of the top cover 122. As with the cord guide, the size and shape of an access opening in a top cover of a rack unit in accordance with the present invention depends on the size and numbers of receptacles and/or connectors and the connections to be made. As such, although in FIGS. 2 and 3 (described below) the access opening 220 is depicted as comprising a specific size and shape, it will be appreciated by one skilled in the art and informed by the teachings of the present invention, that an access opening of the present invention may comprise substantially any size and shape needed to facilitate a connection or connections of a rack unit in accordance with the present invention.

Figure 3:
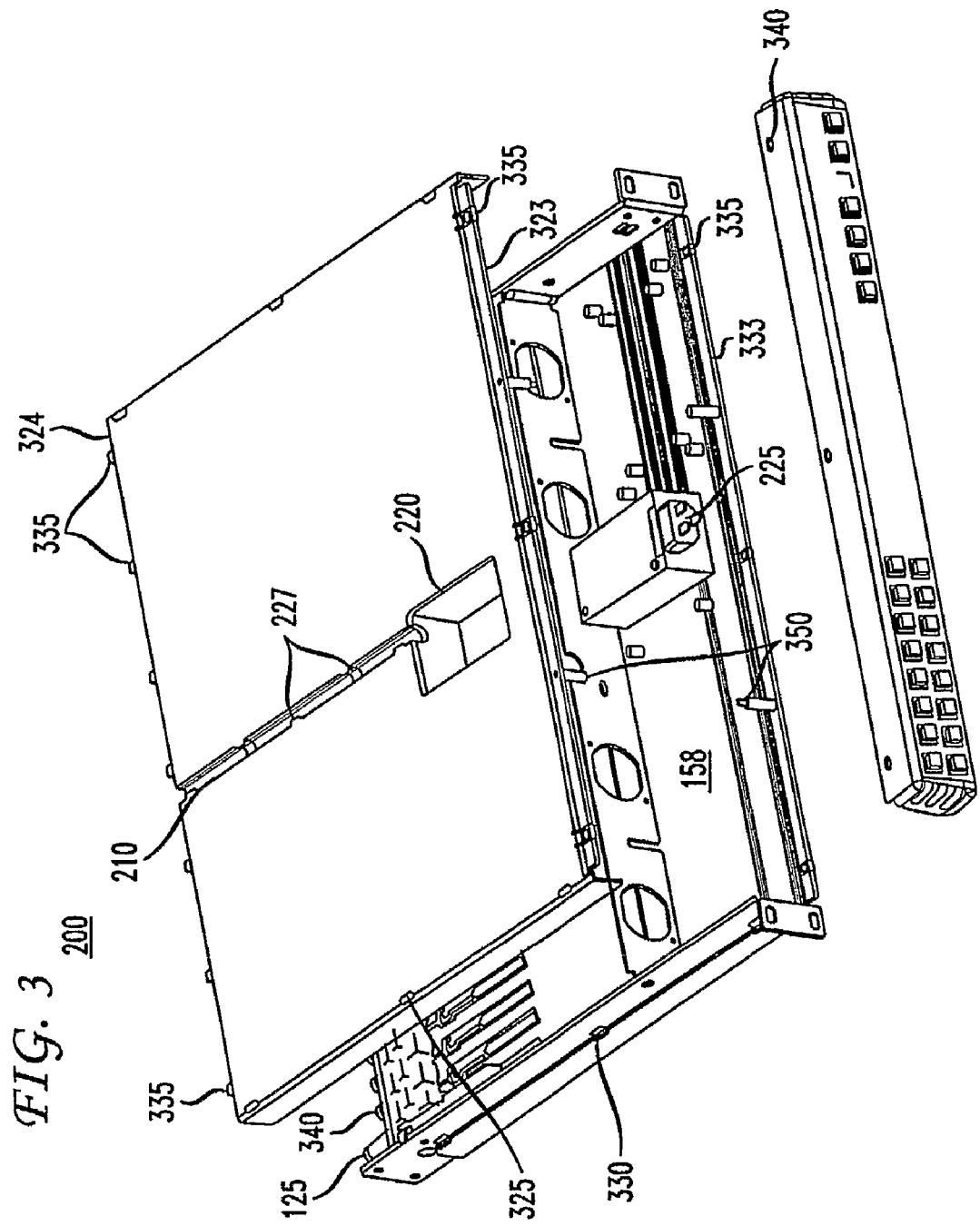
FIG. 3 depicts more detailed view of the embodiment of the single rack unit of FIG. 2.

FIG. 3 depicts an alternate view of an embodiment of the audio/video router 200 of FIG. 2 with the top cover 122 lifted, exposing a portion of the inside of the audio/video router 200. As previously described and as depicted in FIG. 3, the power connection of the audio/video router 200 of FIG. 2 is located near the forward half of the audio/video router 200. The audio/video router 200 of FIG. 3 comprises a power supply circuitry chamber 158 for housing power components of the audio/video router 200. Having such a configuration (i.e., having the power supply circuitry chamber and power connection located near the forward half of the audio/video router), a rack unit in accordance with the present invention, such as the audio video router 200 of FIGS. 2 and 3, provides more available space near the rear of the audio/video router 200 and in the rear panel (114) for input and output connections, such as input and output audio and video connections 125 for the audio/video router 200.

In addition and as depicted in FIG. 3, the cord guide 210 may optionally further include projections 227 (e.g., tabs) to keep a routed cord in the cord guide 210. Such projections 227 may be manufactured as an integral part of the top cover 122 as depicted in FIG. 3. In one embodiment of the present invention, the projections (tabs) 227 create an interference fit for a cord guided by the cord guide 210 such that the cord does not inadvertently come out of the cord guide 210.

Although in FIGS. 2 and 3 the cord guide 210 and the access opening 220 in the top cover 122 of the audio/video router 200 are depicted as being located near the center of the top cover 122, in alternate embodiments of the present invention a cord guide and an associated access opening may be located substantially anywhere along the top cover (or bottom cover as described below) of a rack unit in accordance with the present invention to facilitate the connection of a cord to a connection (receptacle) of the rack unit as described herein. Furthermore, although in FIGS. 2 and 3 only one cord guide 210 and access opening 220 are depicted, alternate embodiments of a rack unit in accordance with the present invention may comprise more than one cord guide and access opening for facilitating more than one connection necessary for a rack unit. That is, a rack unit in accordance with the present invention may comprise any combination of cord guides and access openings for facilitating power connections, or other connections as described above, to one or more included connectors (receptacles) in a rack unit.

In addition, although in the audio/video router 200 of FIG. 2 and FIG. 3 only the top cover 122 is depicted as comprising a cord guide 210 and an access opening 220, in alternate embodiments of the present invention, either the top cover alone, the bottom cover alone, or both covers (described in greater detail below) of an audio/video router in accordance with the present invention may comprise a cord guide and an access opening for facilitating power connections, or other connections, in accordance with the present invention. More specifically, in an embodiment of the present invention in which a rack unit of the present invention provides both a primary and a secondary (redundant) power, a rack unit of the present invention utilizes any combination of cord guides and access openings in accordance with the present invention for facilitating the power connections for primary and secondary power receptacles.

For example, in one embodiment of the present invention, a primary and a redundant power are provided in substantially the same area of the top of a rack unit in accordance with the present invention. In such an embodiment, a top cover of the rack unit comprises a single cord guide large enough to route two power cords and a single access opening for facilitating the connection of the two power cords to a power receptacle or power receptacles of the rack unit for providing the primary and redundant power. In an alternate embodiment of the present invention, a primary and a redundant power are provided in different areas of the top of a rack unit. In such an embodiment, a top cover of the rack unit comprises two separate cord guides to route two respective power cords and a two access openings for facilitating the connection of each of the two power cords to a respective power receptacle of the rack unit for providing the primary and redundant power. In yet an alternate embodiment of the present invention, a primary power is provided on the top side and a redundant power is provided on the bottom side (or vice versa) of a rack unit in accordance with the present invention. In such an embodiment, a top cover of the rack unit comprises a single cord guide to route a power cord and an access opening for facilitating the connection of the power cord to a power receptacle on the top side of the rack unit for providing the primary power and a bottom cover of the rack unit comprises a single cord guide to route a power cord and an access opening for facilitating the connection of the power cord to a second power receptacle on the bottom side of the rack unit for providing the redundant power.

Referring back to FIG. 3, the audio/video router 200 illustratively comprises an IEC power receptacle 225 which snaps into the base 112, and optionally also snaps into the cover 122, for locating the IEC power receptacle 225 and similarly for locating the top cover 122 (and the bottom cover in embodiments where a power receptacle is located on the bottom of a rack unit of the present invention). As previously described, the access opening 220 provides access to the IEC receptacle such that a power cord, guided by the cord guide 210, is able to be plugged into the IEC connector.

In various embodiments of the present invention, a rack unit in accordance with the present invention comprises means for securing at least the top cover of the rack unit to the rack unit chassis without utilizing hardware to assemble. For example, the audio/video router 200 of FIG. 3 optionally comprises male protrusions 325 on the inside of the top cover 122 which engage with corresponding cutouts 330 in the chassis 110 for securing the top cover 122 to the chassis 110. Furthermore, the top cover 122 may optionally further comprise tabs 335 on the front edge 323 and rear edge 324 for engaging with cutouts 340 on the rear panel 114 and the front panel 120 for securing the rear panel 114 and the front panel 120 to the top cover 122. Securing the various panels and covers of a rack unit in accordance with this embodiment of the present invention facilitates proper grounding between the various components of the rack unit and also provides stiffness of form and more support for I/O cards inserted into the rack unit.

Additionally, the bottom cover 112 of the audio/video router 200 of FIG. 3 may optionally comprise a substantially similar form and as such substantially similar securing means as the top cover 122. That is, the bottom cover 112 may comprise male protrusions (not shown) on the inside of the bottom cover 112 which engage with corresponding cutouts (not shown) in the chassis 110 for securing the top cover 122 to the chassis 110 and may comprise tabs 335 on the front edge 333 and rear edge for engaging with cutouts 340 on the rear panel 114 and the front panel 120 for securing the rear panel 114 and the front panel 120 to the bottom cover 112. By providing a substantially similar top cover 122 and bottom cover 112 in accordance with this embodiment of the present invention, increased production volume results in reduced costs.

Although in the audio/video router 200 of FIG. 3 the top cover 122 and the bottom cover 112 are depicted as comprising tabs 335 and male protrusions 325 and the chassis is depicted as comprising cutouts 330 and 340, in alternate embodiments of the present invention, the top cover 122 and the bottom cover 112 may comprise the cutouts 330 and 340 and the chassis 110 may comprise the tabs 335 and the male protrusions 325.

In various embodiments of the present invention and as depicted in FIG. 3, a rack unit in accordance with the present invention, such as the audio/video router 200, optionally comprises male and/or female posts for structural support. More specifically and as depicted in FIG. 3, the top cover 122 of the audio/video router 200 comprises at least one post 350 for providing support for the audio/video router 200. In addition, the bottom cover 112 of the audio/video router 200 optionally also comprises at least one post 350 for providing support for the audio/video router 200. However, although the top cover 122 and the bottom cover 112 of the audio/video router 200 of FIG. 3 are depicted as both comprising one male and one female post, in alternate embodiments of the present invention, a top cover and bottom cover may comprise any combination of male and/or female post or alternatively, either only the top cover or the bottom cover may comprise at least one post for providing support for a rack unit in accordance with the present invention.

Figure 4:
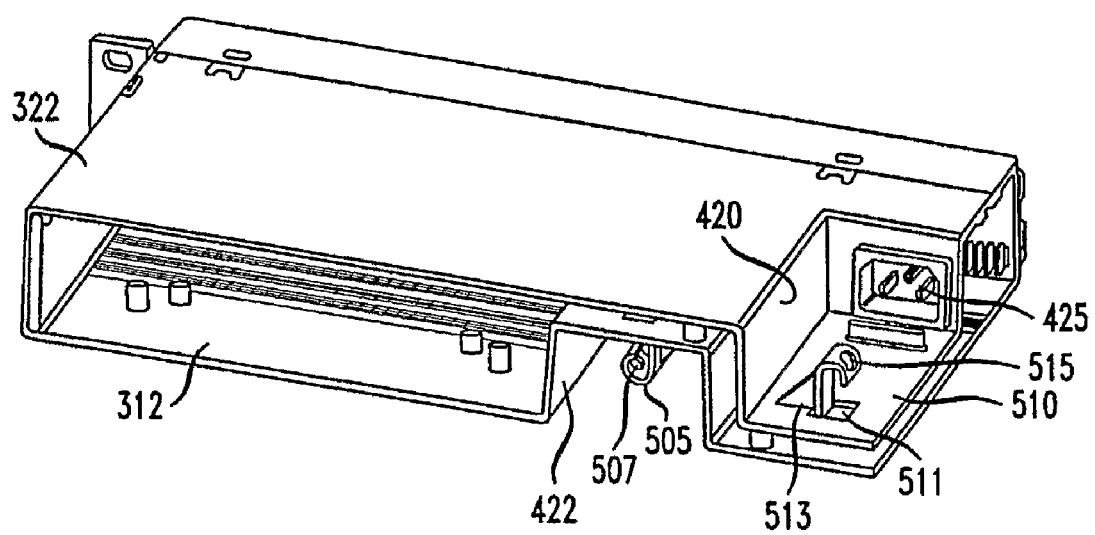
FIG. 4 depicts a high level sectional diagram of an embodiment of a rack unit of the present invention including a securing and strain relief means in accordance with an embodiment of the present invention.

In addition, in various embodiments of the present invention a rack unit optionally further comprises a means for securing and strain relief of a cord connected to a receptacle of the rack unit such that a connector on the cord does not inadvertently disconnect or disengage from the receptacle of the rack unit. For example, FIG. 4 depicts a high level sectional diagram of an embodiment of a rack unit of the present invention including a securing and strain relief means in accordance with an embodiment of the present invention. The portion of the rack unit 400 depicted in FIG. 4 illustratively comprises a top cover 322 including an access opening 420 a power receptacle 425, and a securing and strain relief hook 505 and a bottom cover 312 including an access opening 422 and a securing and strain relief hook 507. The securing and strain relief hooks 505 and 510 of FIG. 4 illustratively comprise a base portion 511 secured to the base of the respective access openings, respective rib portions 513 for providing support for and strengthening the hooks 505 and 510, and respective hook portions 515 for engaging a routed cord.

As evident from FIG. 4, a cord, such as a power cord, and an associated connector at the end of the cord routed to a respective receptacle, such as the power receptacle 425, is prevented from being inadvertently disconnected or disengaged from the respective receptacles by the securing and strain relief hooks 505 and 510. More specifically, the securing and strain relief means of the present invention, such as the securing and strain relief hooks 505 and 510, exhort downward pressure on a cord routed to a receptacle thus providing strain relief for the cord and also provide a means of blocking a connector of the cord from disengaging from a receptacle, such as the power receptacle 425.

While the forgoing is directed to various embodiments of the present invention, other and further embodiments of the invention can be devised without departing from the basic scope thereof. As such, the appropriate scope of the invention is to be determined according to the claims, which follow.

The invention claimed is:

1. A cover for a rack unit assembly having a receptacle within the assembly, comprising:
   a panel for removable attachment to the assembly, said panel comprising an opening in a top of the panel for permitting a connector on a cord to extend through the top of the panel to releasably engage the receptacle in the assembly,
   a channel originating at said opening for receiving and guiding the cord along the top of the panel; and
   at least one projection formed along said channel for keeping the cord in said channel;
   wherein said channel and said at least one projection are formed such that neither said at least one projection nor the cord protrude out of the top of the panel.

2. The cover of claim 1, wherein said receptacle comprises a power receptacle, said cord comprises a power cord and said connector comprises a power connector.

3. The cover of claim 1, wherein said receptacle comprises a communications receptacle, said cord comprises a communications cord and said connector comprises a communications connector.

4. The cover of claim 1, wherein said projections comprise an integral part of said panel.

5. The cover of claim 1, wherein said opening comprises a means of strain relief for preventing the connector on the cord from inadvertently disengaging from the receptacle.

6. A rack unit assembly comprising:
   a chassis having a receptacle therein; and
   a top cover for removable attachment to the chassis, said top cover comprising an opening on a top side for permitting a connector on a cord to extend through the top cover to releasably engage the receptacle in the chassis,
   a channel originating at said opening for receiving and guiding the cord along the top of the top cover; and
   at least one projection formed along said channel for keeping the cord in said channel;
   wherein said channel and said at least one projection are formed such that neither said at least one projection nor the cord does not protrude out of the top side of the top cover.

7. The rack unit assembly of claim 6, further comprising:
   a bottom cover for removable attachment to the chassis
   a front panel for removable attachment to said top cover and said bottom cover; and
   a rear panel for removable attachment to said top cover and said bottom cover.

8. The rack unit assembly of claim 7, wherein the receptacle in said rack unit assembly is located on a bottom side of said chassis and said bottom cover comprises an opening for permitting a connector on a cord to extend through the bottom cover to releasably engage the receptacle in the chassis, and a channel originating at said opening for receiving and guiding the cord.

9. The rack unit assembly of claim 7, wherein said rack unit is assembled without utilizing hardware.

10. The rack unit assembly of claim 9, wherein said top cover and said bottom cover each comprise at least one male protrusion for engaging with at least one corresponding cutout in said chassis for securing said top cover and said bottom cover to said chassis.

11. The rack unit assembly of claim 9, wherein said top cover and said bottom cover each comprise at least one tab for engaging with at least one corresponding cutout in said rear panel and said front panel for securing said rear panel and said front panel to said top cover and said bottom cover.

12. The rack unit assembly of claim 7, wherein said bottom cover further comprises posts for structural support of the rack unit assembly.

13. The rack unit assembly of claim 6, wherein said receptacle comprises a power receptacle, said cord comprises a power cord and said connector comprises a power connector.

14. The rack unit assembly of claim 6, wherein said receptacle comprises a communications receptacle, said cord comprises a communications cord and said connector comprises a communications connector.

15. The rack unit assembly of claim 6, wherein said projections comprise an integral part of said top cover.

16. The rack unit assembly of claim 6, wherein said receptacle is located in a forward compartment of said chassis.

17. The rack unit assembly of claim 16, wherein said rack unit assembly comprises more input and output connectors, connections of which are facilitated through a rear panel of said rack unit assembly, than a second rack unit assembly comprising a receptacle located near the rear of a respective chassis and having a connection facilitated through a rear panel of said second rack unit assembly.

18. The rack unit assembly of claim 6, wherein said top cover further comprises posts for structural support of the rack unit assembly.

* * * * *